(12) United States Patent
Takayama et al.

(10) Patent No.: US 8,933,568 B2
(45) Date of Patent: Jan. 13, 2015

(54) SEMICONDUCTOR DEVICE

(75) Inventors: Tsuyoshi Takayama, Tokyo (JP); Yukio Yasuda, Tokyo (JP); Hajime Kato, Tokyo (JP); Kazuaki Hiyama, Tokyo (JP); Taishi Sasaki, Tokyo (JP); Mikio Ishihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 280 days.

(21) Appl. No.: 12/907,468

(22) Filed: Oct. 19, 2010

(65) Prior Publication Data
US 2011/0221076 A1 Sep. 15, 2011

(30) Foreign Application Priority Data
Mar. 12, 2010 (JP) ................. 2010-055383

(51) Int. Cl.
H01L 23/48 (2006.01)
H01L 23/52 (2006.01)
H01L 29/40 (2006.01)

(52) U.S. Cl.
USPC ..... 257/773; 257/734; 257/772; 257/E23.051

(58) Field of Classification Search
USPC ............................ 257/734, 772, 773, E23.051
See application file for complete search history.

(56) References Cited

U.S. PATENT DOCUMENTS

| 5,940,687 | A | 8/1999 | Davis et al. | |
|---|---|---|---|---|
| 2002/0190388 | A1* | 12/2002 | Eytcheson | 257/773 |
| 2005/0257917 | A1* | 11/2005 | East et al. | 165/104.26 |
| 2006/0157223 | A1* | 7/2006 | Gelorme et al. | 165/80.3 |
| 2010/0019363 | A1* | 1/2010 | Galera et al. | 257/676 |

FOREIGN PATENT DOCUMENTS

| CN | 101103658 A | 1/2008 |
|---|---|---|
| JP | 55-93230 | 7/1980 |
| JP | 55-117250 | 9/1980 |
| JP | 62-198140 | 9/1987 |
| JP | 63-73700 | 4/1988 |
| JP | 2000-223631 | 8/2000 |
| JP | 2001-230351 A | 8/2001 |
| JP | 2004-174522 A | 6/2004 |
| JP | 2005-93842 A | 4/2005 |
| JP | 2005-93996 A | 4/2005 |

(Continued)

OTHER PUBLICATIONS

German Office Action issued Apr. 23, 2012, in German Patent Application No. 10 2011 002 535.9 (with English Translation).

(Continued)

Primary Examiner — Ha Tran T Nguyen
Assistant Examiner — Aaron Dehne
(74) Attorney, Agent, or Firm — Oblon, Spivak, McClelland, Maier & Neustadt, L.L.P.

(57) ABSTRACT

A semiconductor device according to the present invention includes: a power semiconductor element that is a semiconductor element; bonding parts provided for bonding of an upper surface and a lower surface of the semiconductor element; and metal plates bonded to the power semiconductor element from above and below through the bonding parts, wherein the bonding part includes a mesh metal body disposed between the semiconductor element and the metal plate, and a bonding member in which the mesh metal body is embedded.

15 Claims, 10 Drawing Sheets

(56) References Cited

FOREIGN PATENT DOCUMENTS

| | | | |
|---|---|---|---|
| JP | 2005-251771 | | 9/2005 |
| JP | 2005251771 A | * | 9/2005 |

OTHER PUBLICATIONS

Office Action issued Oct. 23, 2012, in Japanese Patent Application No. 2010-055383 with Partial English translation.

Chinese Office Action dated Apr. 2, 2013, in corresponding application No. 2010105866642, with English translation.

Chinese Office Action dated Feb. 12, 2014, in a Chinese counterpart 201010586664.2, with a partial English translation.

Office Action dated Aug. 29, 2014, in a Chinese counterpart, with English translation.

* cited by examiner

F I G. 3
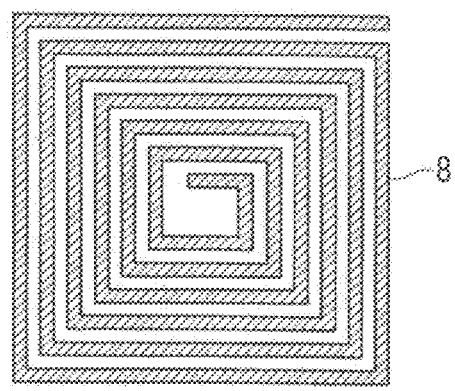

F I G. 1 1
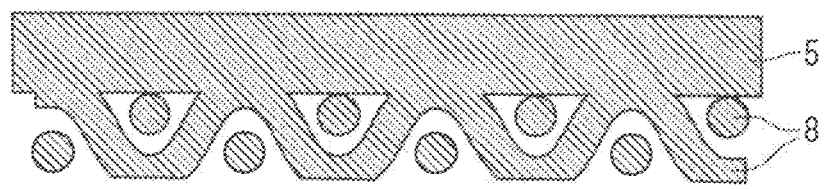
F I G. 1 2
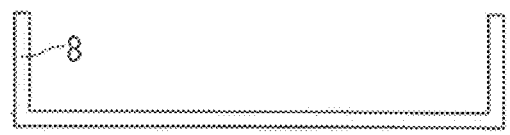
F I G. 1 3
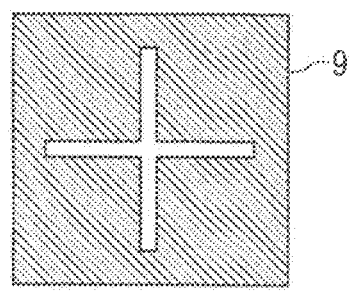

F I G. 1 4
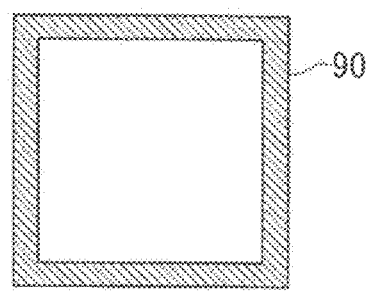
F I G. 1 5
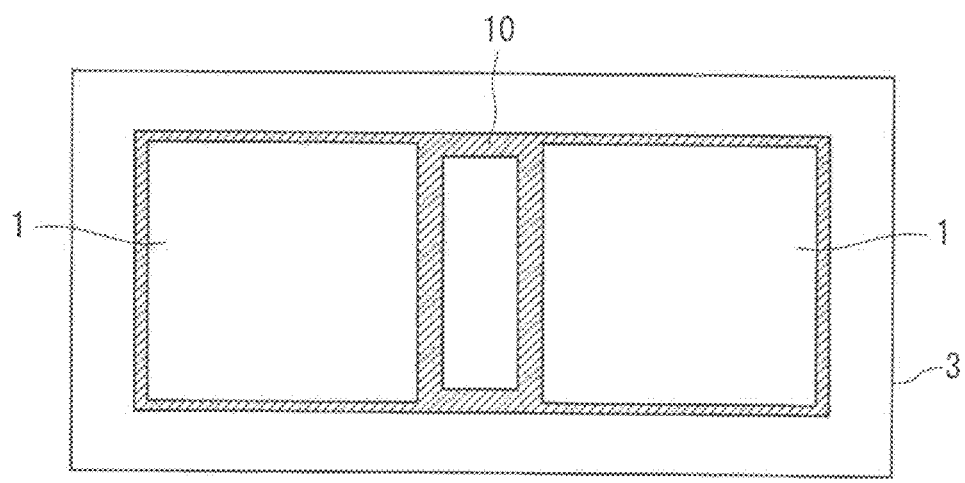

US 8,933,568 B2

SEMICONDUCTOR DEVICE

BACKGROUND OF THE INVENTION

1. Field of the Invention

The present invention relates to a semiconductor device, and more particularly, to bonding between a power semiconductor element and a metal plate in the semiconductor device.

2. Description of the Background Art

A power semiconductor element in a semiconductor device controls an amount of a current flowing between a front surface and a back surface thereof, and heat is generated due to power loss in a case where the current flows. For this reason, the power semiconductor element is connected to a metal conductor used for conduction as well as heat dissipation with the use of a bonding material (bonding member) such as solder, to thereby perform electrical connection with the outside and heat dissipation.

In a case where a power semiconductor element itself is increased in size for controlling a large current, and the thickness of a heat sink is increased for improving heat dissipation properties of the heat generated as a result of this, there is a fear that a difference in coefficient of linear expansion between a metal conductor and a power semiconductor element may cause distortions in the power semiconductor element, which may break the semiconductor element.

In order to prevent the power semiconductor element from being broken, it is required to increase the thickness of a bonding member that connects a metal conductor and a power semiconductor element, but the solder used as the bonding member has lower heat conductivity and conductivity than those of the metal conductor, leading to a problem that heat dissipation properties as well as electrical resistance are deteriorated.

As the method of solving the above-mentioned problem, Japanese Patent Application Laid-Open No. 55-93230 and Japanese Patent Application Laid-Open No. 62-198140 describe the method of disposing a mesh metal body between a power semiconductor element and a metal conductor, to thereby bond the power semiconductor element to the metal conductor while immersing a bonding member (for example, solder) for bonding them.

However, even the methods described in Japanese Patent Application Laid-Open No. 55-93230 and Japanese Patent Application Laid-Open No. 62-198140 have a problem that heat dissipation properties are deteriorated in a case where the thickness of the bonding member is increased for controlling a much larger current.

SUMMARY OF THE INVENTION

An object of the present invention is to provide a semiconductor device in which, for example, heat dissipation properties are suppressed from becoming deteriorated even in a case of controlling a large current.

A semiconductor device according to the present invention includes a semiconductor element, bonding parts provided for bonding of an upper surface and a lower surface of the semiconductor element, and metal plates bonded to the semiconductor element from above and below through the bonding parts. The bonding part includes a mesh metal body disposed between the semiconductor element and the metal plate, and a bonding member in which the mesh metal body is embedded.

According to the semiconductor device of the present invention, it is possible to achieve efficient heat dissipation to the metal plates on the upper surface and the lower surface of the semiconductor element.

These and other objects, features, aspects and advantages of the present invention will become more apparent from the following detailed description of the present invention when taken in junction with the accompanying drawings.

BRIEF DESCRIPTION OF THE DRAWINGS

FIG. 3 is a schematic top view of a metal obtained by processing metal wires of a mesh metal body of the semiconductor device according to the first preferred embodiment into a spiral shape;

FIGS. 10 and 11 are cross-sectional views of a metal of the semiconductor device according to the third preferred embodiment, in which the metal body and a metal plate are pressed to be integrated;

FIG. 12 is a schematic cross-sectional view of a metal of the semiconductor device according to the third preferred embodiment, in which four corners of the mesh metal body are bent;

FIGS. 13 and 14 are top views of a partly-punched mesh metal body of a semiconductor device according to a fourth preferred embodiment;

FIG. 15 is a top view of a mesh metal body of the semiconductor device according to the fourth preferred embodiment, in which gaps between a plurality of power semiconductor elements are punched.

DESCRIPTION OF THE PREFERRED EMBODIMENTS

Figure 16:
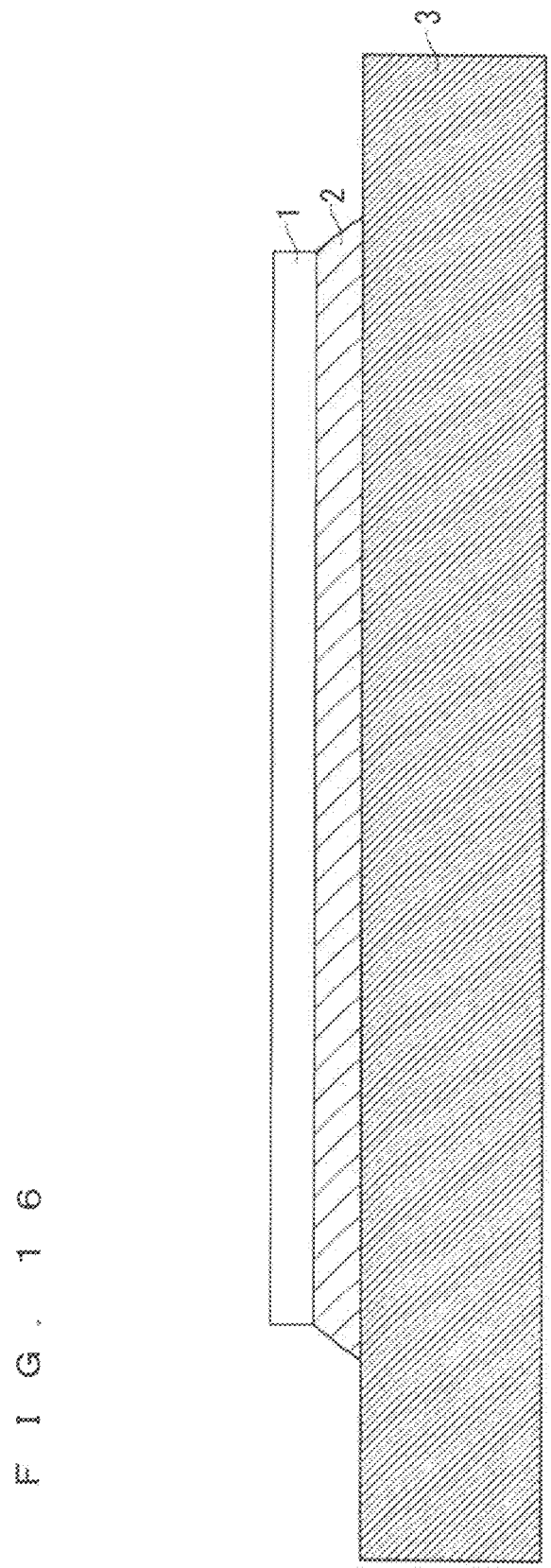
FIGS. 16 and 17 are cross-sectional views of a bonding part between a power semiconductor element and a metal plate of a semiconductor device according to the underlying technology of the present invention.

FIG. 16 is a cross-sectional view of a semiconductor device according to the underlying technology of the present invention. In the semiconductor device of FIG. 16, a bonding member 2 is disposed between a power semiconductor element 1 and a metal plate 3, and the power semiconductor element 1 is bonded to the metal plate 3 through the bonding member 2.

In a case where heat causes expansion, in order to prevent that a difference in coefficient of linear expansion between the metal plate 3 and the power semiconductor element 1 causes distortions in the power semiconductor element 1, and accordingly the power semiconductor element 1 is broken, the bonding member 2 connecting the metal plate 3 and the power semiconductor element 1 is required to have a large thickness. However, for example, solder used as the bonding member 2 for increasing a thickness has lower heat conductivity and conductivity than those of the metal plate 3, and thus heat dissipation properties as well as electrical resistance become deteriorated as the thickness increases.

Figure 17:
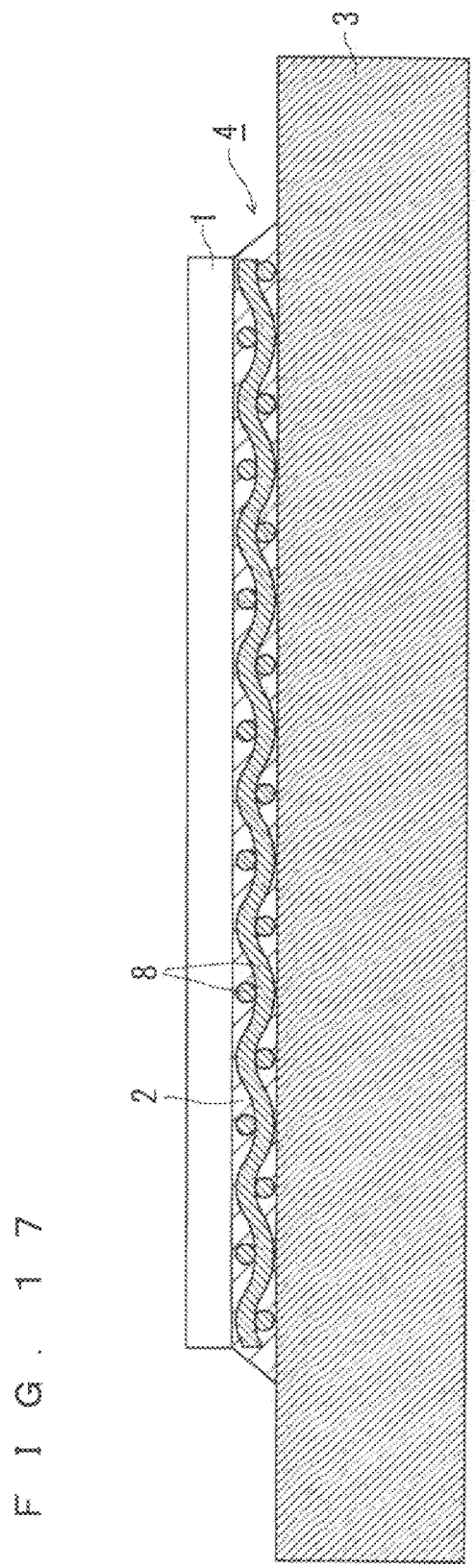

Therefore, the method is proposed as shown in FIG. 17, in which a bonding member 2 and a mesh metal body 8 formed by weaving metal thin wires are disposed in a bonding part 4 between the power semiconductor element 1 and the metal plate 3, to thereby bond the power semiconductor element 1 to the metal plate 3 while immersing the bonding member 2 for bonding in the mesh metal body 8 (see Japanese Patent Application Laid-Open No. 55-93230 and Japanese Patent Application Laid-Open No. 62-198140).

As shown in FIG. 17, the power semiconductor element 1 is bonded to the metal plate 3 through the bonding part 4 including the mesh metal body 8 in which the bonding member 2 is immersed. The mesh metal body 8 is capable of serving as a spacer for keeping the thickness of the bonding member 2 having a large thickness uniform. In addition, the mesh metal body 8 is configured so as to connect the power semiconductor element 1 and the metal plate 3 through a gap therebetween, and thus the heat and current generated in the power semiconductor element 1 are effectively conducted to the metal plate 3. Accordingly, it is possible to keep heat conductivity as well as conductivity high even when the thickness of the bonding member 2 is increased.

Note that the mesh metal body 8 can facilitate uniform spread of the melted bonding member 2 owing to the effects of capillaries generated in a minute gap having a mesh structure thereof.

As shown in FIG. 17, the mesh metal body 8 meanders in cross section between the power semiconductor element 1 and the metal plate 3. This meandering shape mitigates linear expansion by the mesh metal body 8, which has a function of reducing an apparent coefficient of linear expansion of the bonding part 4 between the power semiconductor element 1 and the metal plate 3. Generally, though the metal plate 3 has a higher coefficient of linear expansion compared with the power semiconductor element 1, a coefficient of linear expansion is mitigated owing to the effect of the above-mentioned meandering shape even when the same metal used for the metal plate 3 is used for the mesh metal body 8, whereby it is possible to reduce distortions generated in the power semiconductor element 1 due to thermal expansion.

However, a semiconductor device that does not degrade heat dissipation properties or the like thereof is required in a case where the thickness of the bonding part 4 is increased for controlling a much larger current. The preferred embodiments described below are aimed to solve the above-mentioned problem.

(A. First Preferred Embodiment)
(A-1. Configuration)

Figure 1:
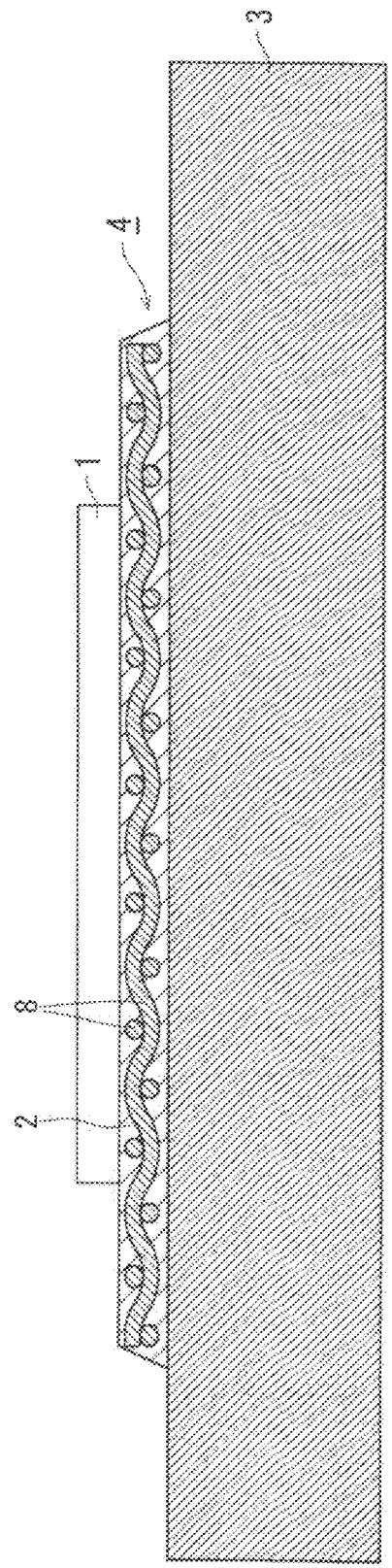
FIGS. 1 and 2 are cross-sectional views of a bonding part between a power semiconductor element and a metal plate of a semiconductor device according to a first preferred embodiment.

First, as shown in FIG. 1, it is possible to form a semiconductor device including a mesh metal body 8 configured to be large with respect to the power semiconductor element 1 in plan view. In this case, a heat dissipation path in a horizontal direction increases in width, which reduces a thermal resistance.

Figure 2:
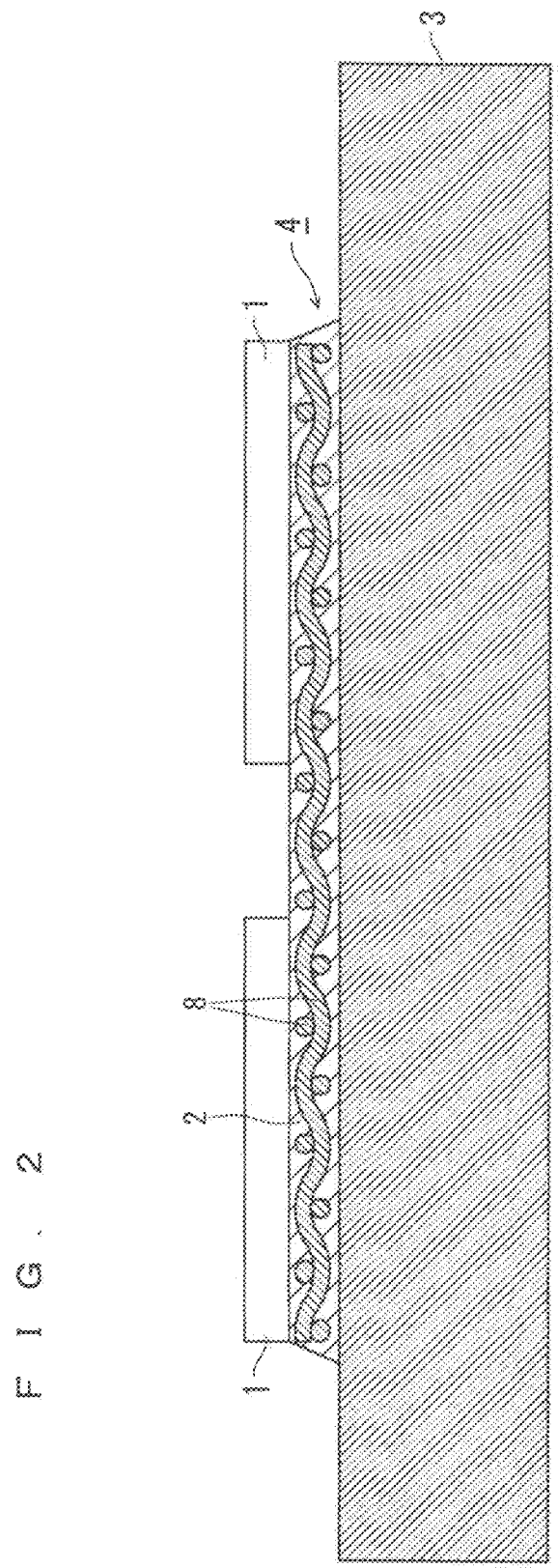

Further, as shown in FIG. 2, it is possible to form a semiconductor device in which a plurality of power semiconductor elements 1 are mounted onto the same bonding part 4, that is, such that the bonding part 4 is disposed to the lower surfaces of the plurality of power semiconductor elements 1 in common. In a case where a plurality of power semiconductor elements 1 are bonded to the metal plate 3, it suffices that only one bonding part 4 is provided, which improves the assembling property compared with a case where the bonding part 4 is provided for each of the power semiconductor elements 1.

Further, as shown in FIG. 3, it is possible that at least one of intersecting metal wires of the mesh metal body 8 in the bonding part 4 is included by being spirally woven when viewed from above in plan view. In this case, the mesh metal body 8 is easily formed, which suppresses increases in thermal resistance and electrical resistance and mitigates a thermal stress.

Figure 4:
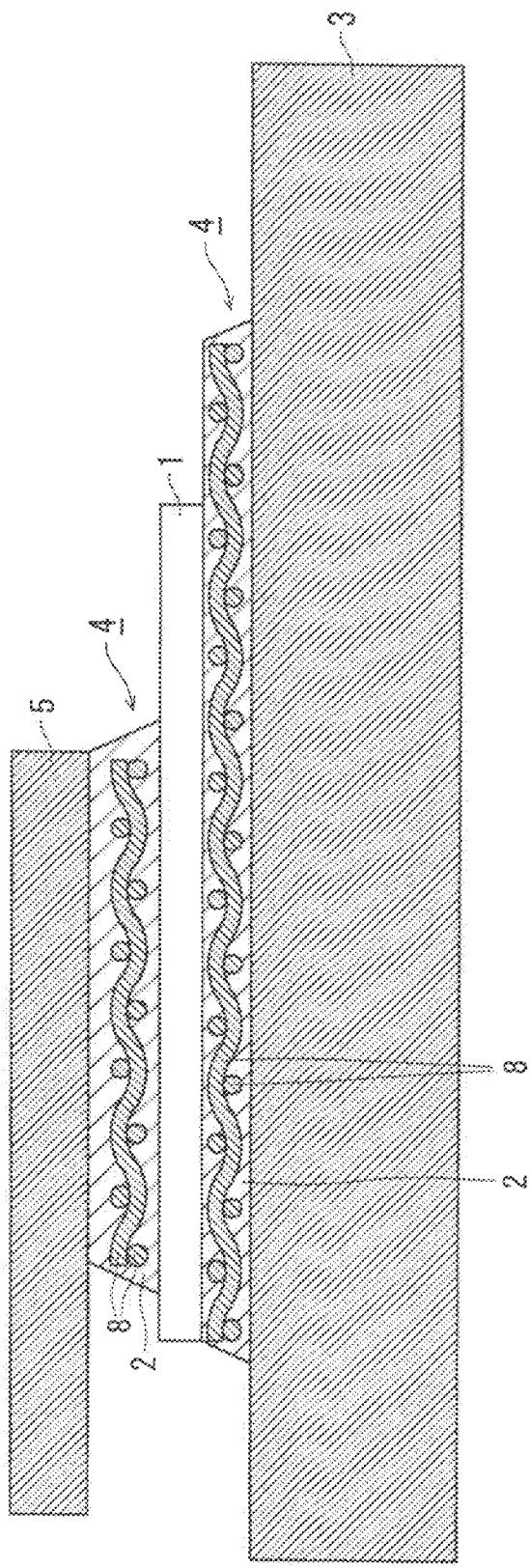
FIGS. 4 and 5 are cross-sectional views of the bonding parts between the power semiconductor element and the metal plates of the semiconductor device according to the first preferred embodiment.

FIG. 4 shows a semiconductor device in which, in addition to the configuration including the metal plate 3, the bonding part 4 and the power semiconductor element 1 configured as shown in FIGS. 1 to 3, the bonding part 4 including the mesh metal body 8 (embedded) is also disposed on the surface (upper surface) of the power semiconductor element 1, and is further sandwiched between the power semiconductor element 1 and the metal plate 5 from above. Here, the metal plate 5 is disposed substantially parallel to the metal plate 3.

In a case where an electrode on the upper surface of the power semiconductor element 1 is bonded by a plate-like metal (electrode plate) such as a copper plate, similarly to the back surface, the mesh metal body 8 is provided to the bonding portion thereof, with the result that increases in thermal resistance and electrical resistance on the upper surface and the lower surface of the power semiconductor element 1 can be suppressed effectively to enable efficient heat dissipation, and the thermal stress applied on the surface of the power semiconductor element 1 can be mitigated.

Figure 5:
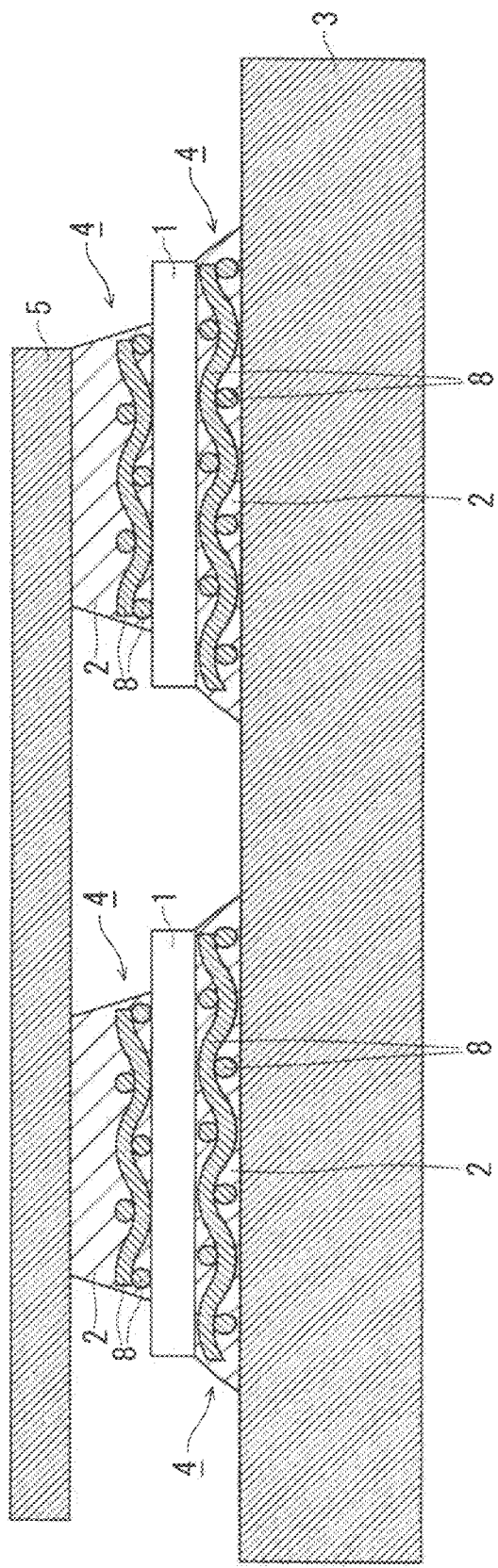

FIG. 5 is shows a state in which a plurality of bonding parts 4 respectively disposed on upper surfaces of the power semiconductor devices 1 are arranged, and the bonding parts 4 respectively disposed on the upper surfaces of the power semiconductor elements 1 are sandwiched by the common metal plate 5 to be bonded. In a case where the respective power semiconductor elements 1 have different thicknesses, the heights of the upper surfaces of the power semiconductor elements 1 differ as a result of different thicknesses. Accordingly, processing such as providing a step to the metal plate 5 is required in some cases. Therefore, the heights of the upper surfaces of the power semiconductor elements 1 can be made uniform by adjusting the thickness of the bonding part 4 in accordance with the thickness of each of the power semiconductor elements 1, and thus the processing such as providing a step to the metal plate 5 is not required.

Herein, for example, solder is conceivable as the bonding member 2, but it is possible to select a conductive adhesive such as a silver epoxy in place of solder. In this case, an electrical resistance and a thermal resistance are reduced compared with bonding by solder, which mitigates a thermal stress further.

Note that it is possible to immerse the bonding member 2 in the mesh metal body 8 in advance. In this case, it saves a trouble of immersing the bonding member 2 in bonding the power semiconductor element 1, the bonding part 4 and the metal plate 3, which facilitates bonding to increase the assembling property.

Further, a thermal stress can be mitigated further by using, for the mesh metal body 8, a metal such as molybdenum that has a coefficient of linear expansion substantially equal to that of the power semiconductor element 1, that is, a metal having a small coefficient of linear expansion.

(A-2. Effects)

According to the first preferred embodiment of the present invention, the semiconductor device includes the power semiconductor element 1 that is a semiconductor element, the bonding parts 4 provided for bonding of an upper surface and a lower surface of the power semiconductor element 1, and the metal plates 3 and 5 bonded to the power semiconductor element 1 from below and above through the bonding parts 4, in which the bonding part 4 includes the mesh metal body 8 disposed between the power semiconductor element 1 and the metal plate 3 or 5, and the bonding member 2 in which the mesh metal body 8 is embedded. Accordingly, increases in thermal resistance and electrical resistance on the upper surface and the lower surface of the power semiconductor element 1 can be suppressed and heat dissipation is performed efficiently, and a thermal stress applied on the surface of the power semiconductor element 1 can be mitigated.

Further, according to the first preferred embodiment of the present invention, in the semiconductor device the power semiconductor element 1 includes a plurality of power semiconductor elements 1, the bonding parts 4 are provided for bonding of upper surfaces and lower surfaces of the plurality of power semiconductor elements 1, and the metal plates 3 and 5 are bonded to the plurality of power semiconductor elements 1 from below and above through the bonding parts 4. Accordingly, the processing such as providing a step to the metal plate 5 is not required, which improves assembling property.

Further, according to the first preferred embodiment of the present invention, in the semiconductor device, the bonding part 4 is disposed on the lower surfaces of the plurality of power semiconductor elements 1 in common, and thus the bonding part 4 is only required to be placed in common. Accordingly, it is possible to improve assembling property more and achieve further miniaturization as well as cost reduction compared with the case where the bonding part 4 is disposed for each of the power semiconductor elements 1.

Further, according to the first preferred embodiment of the present invention, in the semiconductor device, the coefficient of linear expansion of the mesh metal body 8 is substantially equal to the coefficient of linear expansion of the power semiconductor element 1, and thus a thermal stress is mitigated further.

Further, according to the first preferred embodiment of the present invention, in the semiconductor device, the mesh metal body 8 includes metal wires that are spirally woven in plan view, which facilitates the formation of the mesh metal body 8, suppresses increases in thermal resistance and electrical resistance, and mitigates a thermal stress.

Further, according to the first preferred embodiment of the present invention, in the semiconductor device, the mesh metal body 8 has a larger area than that of the power semiconductor element 1 in plan view, and thus a heat dissipation path in a horizontal direction increases in width. Accordingly, a thermal resistance is reduced, which enables efficient heat dissipation.

Further, according to the first preferred embodiment of the present invention, in the semiconductor device, the bonding member 2 is a conductive adhesive, and thus an electrical resistance and a thermal resistance are reduced. Accordingly, a thermal stress can be mitigated further.

(B. Second Preferred Embodiment)

(B-1. Configuration)

Figure 6:
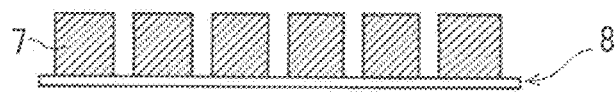
FIG. 6 is a cross-sectional view of a mesh metal body of a semiconductor device according to a second preferred embodiment, to which a columnar metal is bonded.

FIG. 6 is shows a state in which an end of a columnar metal 7 is bonded to the mesh metal body 8 of the semiconductor device described in the first preferred embodiment. That is, the columnar metal 7 is interposed between the mesh metal body 8 and the power semiconductor element 1 and bonds the mesh metal body 8 to the power semiconductor element 1. Note that though not shown in FIG. 6, the columnar metal 7 is embedded in the bonding member 2 together with the mesh metal body 8.

With the above-mentioned configuration, the thickness of the bonding portion can be increased. which further mitigates a thermal stress. In addition, the columnar metal 7 is bonded, and accordingly an electrical resistance can be suppressed from becoming deteriorated even when the thickness of the bonding portion increases.

Figure 7:
FIG. 7 is a cross-sectional view of a metal of the semiconductor device according to the second preferred embodiment, in which the mesh metal body is bonded to both surfaces of the columnar metal.

FIG. 7 shows a state in which the mesh metal body 8 is bonded to both ends of the columnar metal 7. Compared with the case shown in FIG. 6, the thickness of the bonding portion can be increased further, and accordingly a thermal stress can be mitigated further.

(B-2. Effects)

According to the second preferred embodiment of the present invention, in the semiconductor device, the bonding part 4 further includes the columnar metal 7 embedded in the bonding member 2 and having one end bonded to the mesh metal body 8. Accordingly, a thermal stress can be mitigated by increasing the thickness of the bonding portion, and an electrical resistance can be suppressed from becoming deteriorated because the thickness is increased by bonding of the columnar metal 7.

Further, according to the second preferred embodiment of the present invention, in the semiconductor device, the bonding part 4 further includes another mesh metal body 8 embedded in the bonding member 2 and bonded to the other end of the columnar metal 7. Accordingly, the thickness of the bonding portion can be increased, which mitigates a thermal stress.

(C. Third Preferred Embodiment)

(C-1. Configuration)

Figure 8:
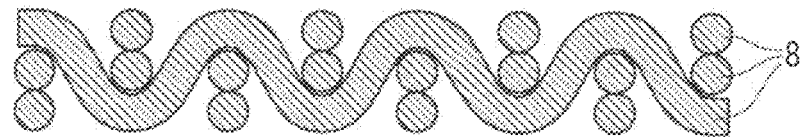
FIG. 8 is a cross-sectional view of a mesh metal body of a semiconductor device according to a third preferred embodiment, in which the number of vertical and horizontal metal wires (metal thin wires) is changed.

The mesh metal body 8 of the semiconductor device, which is shown in FIG. 8, is obtained by changing the number of first and second metal wires (metal thin wires) that intersect vertically and horizontally in the mesh metal body 8 and superimposing ones of the metal wires as shown in FIG. 8. In a case where the thickness of the bonding portion is increased with the above-mentioned structure, a current path and a heat dissipation path hardly differ from those in the cases described in the first and second preferred embodiments while mitigating a thermal stress, and thus it is possible to suppress increases in electrical resistance and thermal resistance.

Figure 9:
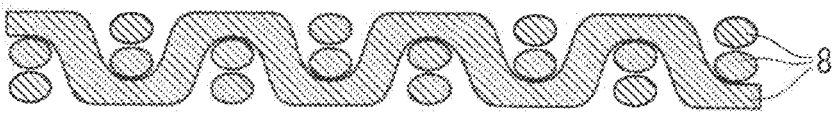
FIG. 9 is a cross-sectional view of a mesh metal body of the semiconductor device according to the third preferred embodiment, in which the number of the vertical and horizontal metal wires (metal thin wires) is changed and pressing is performed.

FIG. 9 shows a state in which the mesh metal body 8 is pressed vertically, and a gap between the metal wires is made smaller. An amount of the bonding member 2 (not shown) immersed in the mesh metal body 8 is reduced, whereby it is possible to reduce an electrical resistance and a thermal resistance. Note that while FIGS. 9 and 10 show the case in which the mesh metal wires are superimposed as shown in FIG. 8, similar effects are obtained by narrowing a gap therebetween by pressing even in the case where the number of metal wires of the mesh metal body 8 are not changed as in the first preferred embodiment.

Figure 10:
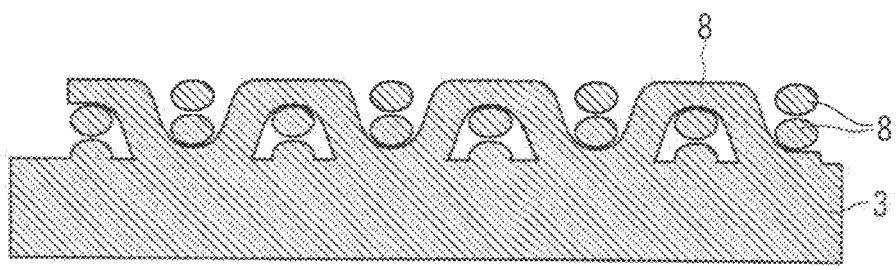

FIG. 10 shows a state in which the mesh metal body 8 and the metal plate 3 are pressed to be integrated. The gap between the mesh metal body 8 and the metal plate 3 is reduced, and thus an amount of the bonding member 2 (not shown) is reduced by that amount, and as a result, an electrical resistance and a thermal resistance between the power semiconductor element 1 and the metal plate 3 can be reduced.

FIG. 11 shows a state in which the mesh metal body 8 and the metal plate 5 are pressed to be integrated (see the first preferred embodiment). The gap between the mesh metal body 8 and the metal plate 5 is made smaller, and thus an amount of the bonding member 2 (not shown) is reduced by that amount, and as a result, an electrical resistance and a thermal resistance between the power semiconductor element 1 and the metal plate 5 can be reduced.

FIG. 12 shows a state in which four corners of the mesh metal body 8 of the semiconductor device are bent. Even in a case where the metal wires are superimposed to obtain a certain thickness, and an amount of the bonding member 2 to be immersed is increased, as shown in FIG. 8, it is possible to prevent the bending member 2 from flowing out from near the bonding part 4.

It is possible to connect an additional plate-like or mesh metal body to a periphery of the mesh metal body 8 in place of bending four corners as shown in FIG. 12 (not shown). Accordingly, it is possible to prevent the bonding member 2 from flowing out.

(C-2. Effects)

According to a third preferred embodiment of the present invention, in the semiconductor device, the mesh metal body 8 includes intersecting first and second metal wires, and ones of the first and second metal wires are superimposed in a thickness direction of the mesh metal body 8. Accordingly, the thickness of the bonding portion can be increased to mitigate a thermal stress, which prevents increases in electrical resistance and thermal resistance.

Further, according to the third preferred embodiment of the present invention, in the semiconductor device, the mesh metal body 8 is compressed in a thickness direction. Accordingly, an amount of the bonding member 2 immersed in the mesh metal body 8 is reduced, which reduces an electrical resistance and a thermal resistance.

Further, according to the third preferred embodiment of the present invention, in the semiconductor device, a periphery of the mesh metal body 8 is bent. Accordingly, even in a case where the metal wires are superimposed for obtaining a certain thickness to increase an amount of the bonding member 2 to be immersed, it is possible to prevent the bonding member 2 from flowing from near the bonding part 4.

Further, according to the third preferred embodiment of the present invention, in the semiconductor device, the mesh metal body 8 further includes a plate-like metal connected to a periphery thereof. Accordingly, even in a case where the metal wires are superimposed for obtaining a certain thickness to increase an amount of the bonding member 2 to be immersed, it is possible to prevent the bonding member 2 from flowing from near the bonding part 4.

Further, according to the third preferred embodiment of the present invention, in the semiconductor device, the mesh metal body 8 is integrated with the metal plates 3 and 5. Accordingly, a gap between the mesh metal body 8 and the plate 3 or 5 is reduced, whereby it is possible to reduce an electrical resistance and a thermal resistance between the power semiconductor element 1 and the metal plate 3 or 5.

(D. Fourth Preferred Embodiment)

(D-1. Configuration)

A mesh metal body of a semiconductor device shown in FIG. 13 has a structure in which part of the mesh metal body is punched in plan view (mesh metal body 9). In the mesh metal body 9, the bonding member 2 is likely to spread in a uniform manner owing to effects of capillaries generated in a minute gap thereof, and the bonding member 2 is more likely to spread in a uniform manner when the semiconductor device includes the mesh metal body 9 provided with a punched portion (hollow region) as shown in FIG. 13.

Further, there may be provided a mesh metal body 90 provided with a punched portion (hollow region) as shown in FIG. 14. That is, the hollow region may be provided in the power semiconductor element 1 except for a region corresponding to an outer periphery thereof. When the mesh metal body 90 as described above is provided, it is possible to mitigate a thermal stress on the outer periphery of the power semiconductor element 1 on which the largest thermal stress is applied, which enables reductions in weight and material cost for a punched portion.

As shown in FIG. 2 of the first preferred embodiment, in a case where a plurality of power semiconductor elements 1 are mounted onto the same bonding part 4, as shown in FIG. 15, there may he provided a mesh metal body 10 having the structure in which the mesh metal body between the plurality of power semiconductor elements 1 is punched. Accordingly, a cost for the punched portion as well as weight can be reduced. Further, it is possible to suppress the bonding members 2 between the power semiconductor elements 1 from coming into contact with each other.

(D-2. Effects)

According to the fourth preferred embodiment of the present invention, in the semiconductor device, the mesh metal body 9, 10, 90 has a hollow region in which meshes are absent in plan view, whereby the bonding member 2 is likely to spread in a uniform manner.

Further, according to the fourth preferred embodiment of the present invention, in the semiconductor device, the mesh metal body 90 has a hollow region in the power semiconductor element 1 except for the region corresponding to the outer periphery thereof. Accordingly, it is possible to mitigate a thermal stress on the outer periphery of the power semiconductor element 1 on which the largest thermal stress is applied, which makes it possible to reduce a material cost for a punched portion and a weight and facilitate manufacture.

Further, according to the fourth preferred embodiment of the present invention, in the semiconductor device, the mesh metal body 10 has a hollow region between a plurality of power semiconductor elements 1, which reduces a material cost for a punched portion as well as a weight. Further, it is possible to suppress the bonding members 2 between the power semiconductor elements 1 from coming into contact with each other.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a semiconductor element;
   bonding parts provided for bonding of an upper surface and a lower surface of said semiconductor element; and
   metal plates bonded to said semiconductor element from below and above through said bonding parts, wherein:
   said bonding parts comprise:
      a mesh metal body disposed between said semiconductor element and said metal plate; and
      a bonding member in which said mesh metal body is embedded, wherein said semiconductor element comprises a plurality of semiconductor elements;
said bonding parts are each provided for bonding of an upper surface and a lower surface of each of said semiconductor elements; and
said metal plates are bonded to said plurality of semiconductor elements from below and above through said bonding parts in common.

2. A semiconductor device, comprising:
a semiconductor element;
bonding parts provided for bonding of an upper surface and a lower surface of said semiconductor element; and
metal plates bonded to said semiconductor element from below and above through said bonding parts, wherein:
said bonding parts comprise:
a mesh metal body disposed between said semiconductor element and said metal plate; and
a bonding member in which said mesh metal body is embedded,
wherein said bonding parts further comprise a columnar metal embedded in said bonding member and having one end bonded to said mesh metal body.

3. The semiconductor device according to claim 2, wherein said bonding parts further comprise another mesh metal body embedded in said bonding member and bonded to the other end of said columnar metal.

4. A semiconductor device, comprising:
a semiconductor element,
bonding parts provided for bonding of an upper surface and a lower surface of said semiconductor element; and
metal plates bonded to said semiconductor element from below and above through said bonding parts, wherein:
said bonding parts comprise:
a mesh metal body disposed between said semiconductor element and said metal plate; and
a bonding member in which said mesh metal body is embedded,
wherein said mesh metal body has a hollow region in which meshes are absent in plan view
wherein said mesh metal body has said hollow region in said semiconductor element except for a region corresponding to an outer periphery thereof,
wherein said semiconductor element comprises a plurality of semiconductor elements, and said bonding parts are disposed on the lower surfaces of said plurality of semiconductor elements in common, and
wherein said mesh metal body has said hollow region between said plurality of semiconductor elements.

5. The semiconductor device according to claim 1, wherein a coefficient of linear expansion of said mesh metal body is substantially equal to a coefficient of linear expansion of said semiconductor element.

6. The semiconductor device according to claim 1, wherein a periphery of said mesh metal body is bent.

7. The semiconductor device according to claim 1, wherein said mesh metal body further comprises a plate-like metal connected to a periphery thereof.

8. A semiconductor device, comprising:
a semiconductor element;
bonding parts provided for bonding of an upper surface and a lower surface of said semiconductor element; and
metal plates bonded to said semiconductor element from below and above through said bonding parts, wherein:
said bonding parts comprise:
a mesh metal body disposed between said semiconductor element and said metal plate; and
a bonding member in which said mesh metal body is embedded, wherein said mesh metal body comprises metal wires spirally woven in plan view.

9. The semiconductor device according to claim 1, wherein said mesh metal body has a larger area than that of said semiconductor element in plan view.

10. The semiconductor device according to claim 1, wherein said mesh metal body is integrated with said metal plates.

11. A semiconductor device, comprising:
a semiconductor element;
a bonding part provided for bonding of a lower surface of said semiconductor element; and
a metal plate bonded to said semiconductor element through said bonding part, wherein:
said bonding part comprises:
a mesh metal body disposed between said semiconductor element and said metal plate; and
a bonding member in which said mesh metal body is embedded; and
said mesh metal body has a larger area than that of said semiconductor element in plan view,
wherein said semiconductor element comprises a plurality of semiconductor elements;
said bonding parts are each provided for bonding of an upper surface and a lower surface of each of said semiconductor elements; and
said metal plates are bonded to said plurality of semiconductor elements from below and above through said bonding parts in common.

12. A semiconductor device, comprising:
a plurality of semiconductor elements;
a bonding part provided for bonding of lower surfaces of said semiconductor elements; and
a metal plate bonded to said semiconductor elements through said bonding part, wherein:
said bonding part comprises:
a mesh metal body disposed between said semiconductor elements and said metal plate; and
a bonding member in which said mesh metal body is embedded; and
said bonding part is disposed on the lower surfaces of said semiconductor elements in common,
wherein said semiconductor element comprises a plurality of semiconductor elements;
said bonding parts are each provided for bonding of an upper surface and a lower surface of each of said semiconductor elements; and
said metal plates are bonded to said plurality of semiconductor elements from below and above through said bonding parts in common.

13. The semiconductor device according to claim 1, wherein said mesh metal body comprises intersecting first and second metal wires, ones of said first and second metal wires being superimposed in a thickness direction of said mesh metal body.

14. The semiconductor device according to claim 1, wherein said mesh metal body is compressed in a thickness direction.

15. The semiconductor device according to claim 1, wherein said bonding member is a conductive adhesive except for solder.

* * * * *